United States Patent
Muniandy et al.

(10) Patent No.: US 8,669,140 B1
(45) Date of Patent: Mar. 11, 2014

(54) METHOD OF FORMING STACKED DIE PACKAGE USING REDISTRIBUTED CHIP PACKAGING

(71) Applicants: Kesvakumar V. C. Muniandy, Klang (MY); Navas Khan Oratti Kalandar, Subang Jaya (MY); Lan Chu Tan, Singapore (SG)

(72) Inventors: Kesvakumar V. C. Muniandy, Klang (MY); Navas Khan Oratti Kalandar, Subang Jaya (MY); Lan Chu Tan, Singapore (SG)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/857,143

(22) Filed: Apr. 4, 2013

(51) Int. Cl.
*H01L 21/50* (2006.01)
*H01L 21/48* (2006.01)
*H01L 21/44* (2006.01)

(52) U.S. Cl.
USPC ........... 438/109; 438/107; 438/112; 438/455; 438/459; 438/667; 257/774; 257/787; 257/796; 257/E23.051

(58) Field of Classification Search
None
See application file for complete search history.

(56) References Cited

U.S. PATENT DOCUMENTS

| | | | |
|---|---|---|---|
| 7,619,901 B2 * | 11/2009 | Eichelberger et al. | 361/763 |
| 7,858,441 B2 * | 12/2010 | Lin et al. | 438/109 |
| 7,993,972 B2 | 8/2011 | Lin et al. | |
| 8,093,704 B2 | 1/2012 | Palmer | |
| 8,354,746 B2 * | 1/2013 | Huang et al. | 257/690 |
| 8,518,746 B2 * | 8/2013 | Pagaila et al. | 438/112 |
| 2009/0127686 A1 | 5/2009 | Yang | |
| 2011/0068481 A1 | 3/2011 | Park | |
| 2012/0001339 A1 | 1/2012 | Malatkar | |

* cited by examiner

*Primary Examiner* — Zandra Smith
*Assistant Examiner* — Khanh Duong
(74) *Attorney, Agent, or Firm* — Charles Bergere

(57) ABSTRACT

A method of making a semiconductor device includes providing a first semiconductor die and a conductive frame member having at least one conductive via. A first encapsulation layer is formed. A first redistribution layer is formed opposite the first encapsulation layer. A second redistribution layer is formed opposite the first redistribution layer. A second semiconductor die is mounted and electrically connected with receptor pads in the second redistribution layer. A third semiconductor die is mounted to the second semiconductor die and electrically connected with bond wires to a conductor in the second redistribution layer. A second encapsulation layer embeds the second and third semiconductor dies, the wires, and the conductor in the second redistribution layer.

20 Claims, 5 Drawing Sheets

US 8,669,140 B1

METHOD OF FORMING STACKED DIE PACKAGE USING REDISTRIBUTED CHIP PACKAGING

BACKGROUND OF THE INVENTION

The present invention is directed to a method of assembling semiconductor devices and, more particularly, to a method of assembling a stacked die package using redistributed chip packaging technology.

In a technique known as redistributed chip packaging (RCP), a redistribution layer provides interconnections between the internal contacts on a semiconductor die and the exposed device contacts at the active face of the device. However, it is difficult to use RCP or any wafer level packaging when creating three-dimensional packages in which multiple dies are connected and contained within a single package structure.

It is critical that the connections between dies in a three-dimensional package be reliable, although it can be difficult to create reliable connections without significantly adding to the manufacturing process, thereby increasing cost. For example, in one conventional method, vias interconnecting multiple dies are etched after the encapsulation process. This procedure presents challenges in drilling and refilling of the vias.

It is therefore desirable to provide a method of assembling three-dimensional packages with reliable connections between dies, including wire bond and flip-chip designs, while offering lower cost and higher throughput.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale. Notably, certain vertical dimensions have been exaggerated relative to certain horizontal dimensions.

DETAILED DESCRIPTION OF THE INVENTION

Figure 1:
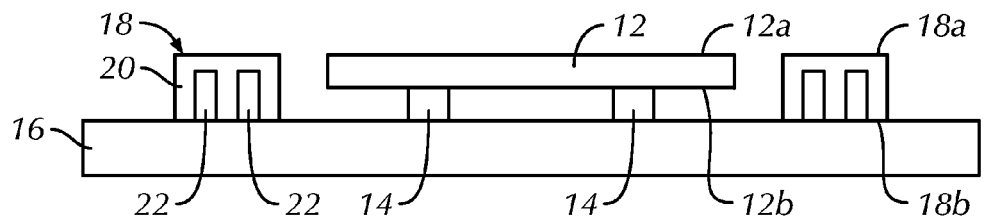
FIG. 1 is a cross-sectional side elevational view of a first semiconductor die and first conductive frame members mounted on a first carrier in accordance with preferred embodiments of the present invention.

Referring to the drawings, wherein the same reference numerals are used to designate the same components throughout the several figures, there is shown in FIGS. 1-8 a first preferred embodiment of a method of making a semiconductor device 10 in accordance with the invention. Referring to FIG. 1, a first or base semiconductor die 12 is provided having a first face 12a and an opposing second face 12b. The first semiconductor die 12 is typically in the form of an integrated circuit (IC) or the like. The first semiconductor die 12 may be made from any semiconductor material or combinations of materials, such as gallium arsenide, silicon germanium, silicon-on-insulator (SOI), silicon, monocrystalline silicon, the like, and combinations of the above.

The first semiconductor die 12 preferably includes one or more contacts 14 provided at the second face 12b thereof. The contacts 14 serve to interconnect components of the first semiconductor die 12 to external components. The contacts 14 may be made from copper (Cu) and/or other conductive materials, and may be coated, alloyed or pre-plated with a metal layer or layers such as gold (Au), nickel (Ni), palladium (PD), tin (Sn) or the like. Although the contacts 14 are shown in FIG. 1 as extending away from the second face 12b of the first semiconductor die 12, the contacts 14 may also be co-planar with and/or at least partially embedded in the second face 12b of the first semiconductor die 12.

The second face 12b of the first semiconductor die 12 is preferably mounted to a first carrier 16, as is conventionally known.

One or more first or bottom conductive frame members 18 are also mounted to the first carrier 16 proximate the first semiconductor die 12. Each first conductive frame member 18 includes a via insulating material 20, such as a dielectric or polymer material, such as oxide, nitride, or the like, and has a first face 18a and an opposing second face 18b.

The via insulating material 20 surrounds and embeds one, and preferably more, first conductive vias 22. The first conductive vias 22 are preferably made from a conductive material such as copper or aluminum. The first conductive vias 22 are preferably exposed at the second face 18b of the first conductive frame member 18, i.e., directly facing the first carrier 16, and extend into the via insulating material 20 toward the first face 18a of the first conductive frame member 18. Although the ends of the first conductive vias 22 opposite the second face 18b of the first conductive frame member 18 are shown as being buried in the via insulating material 20, the ends may alternatively be pre-exposed at the first face 18a of the first conductive frame member 18. One preferred method of forming the first conductive frame members 18 is described, for example, in commonly owned U.S. patent application Ser. No. 13/530,117 filed on Jun. 22, 2012 and entitled, METHOD OF MAKING SURFACE MOUNT STACKED SEMICONDUCTOR DEVICES, the entire contents of which are incorporated by reference herein.

Figure 2:
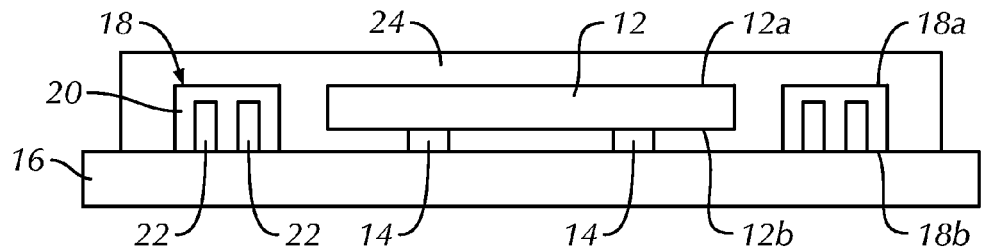
FIG. 2 is a cross-sectional side elevational view of the structure of FIG. 1 following formation of a first encapsulation layer.

Referring to FIG. 2, a first encapsulation layer 24 is formed on the first carrier 16 to embed the first faces 12a, 18a of the first semiconductor die 12 and the first conductive frame members 18. The first encapsulation layer 24 is preferably formed from a mold compound, such as a ceramic material, a polymeric material, or the like. The first encapsulation layer 24 may be formed by liquid encapsulation, compression molding, or the like, followed by curing.

Figure 3:
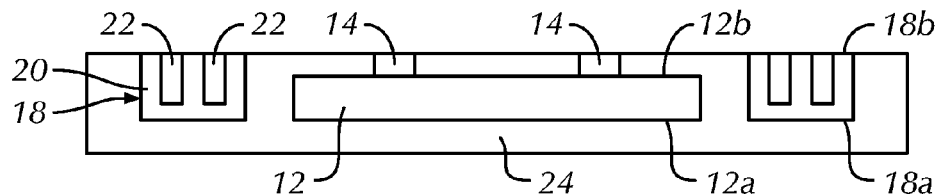
FIG. 3 is an inverted cross-sectional side elevational view of the structure of FIG. 2 following removal of the first carrier.

Referring to FIG. 3, the first carrier 16 is removed to expose the second faces 12b, 18b of the first semiconductor die 12 and the first conductive frame members 18 following formation of the first encapsulation layer 24.

Figure 4:
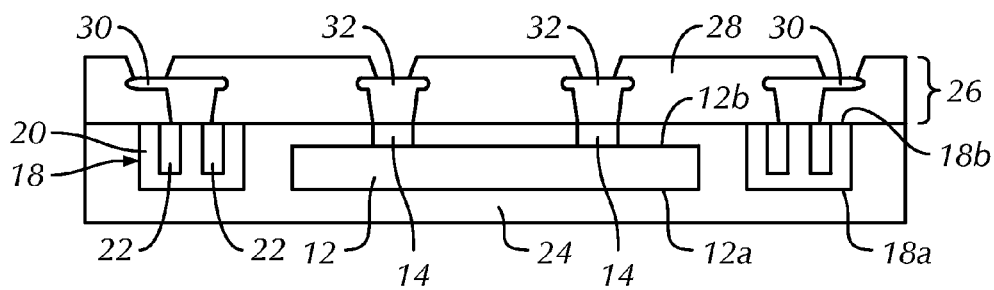
FIG. 4 is a cross-sectional side elevational view of the structure of FIG. 3 following formation of a first redistribution layer.

Referring to FIG. 4, a first redistribution layer 26 is formed on the second faces 12b, 18b of the first semiconductor die 12 and the first conductive frame members 18. The first redistribution layer 26 includes a first non-conductive redistribution material 28 that surrounds an array of first redistribution conductors 30, 32. The first non-conductive redistribution material 28 is preferably a dielectric or polymer material, such as oxide, nitride, or the like. The first redistribution conductors 30, 32 are conversely made from a conductive material, such as copper, aluminum, gold, or the like. The first redistribution conductors 30, 32 preferably extend to a height below that of the first non-conductive redistribution material 28 so as to be recessed within the first redistribution layer 26. However, the first redistribution conductors 30, 32 may also be level with the first non-conductive redistribution material 28, depending on the desired application.

The first redistribution layer 26 may be formed using deposition or growth of the first non-conductive redistribution material 28 in several stages, wherein following each stage trenches are etched using conventional methods in locations corresponding to the locations of the first redistribution conductors 30, 32. The trenches may be filled with the conductive material to partially form the first redistribution conductors 30, 32 prior to the next stage of growth or deposition of the first non-conductive redistribution material 28. Alternatively, the trenches may be etched following the complete deposition or growth of the first non-conductive redistribution material 28 and thereafter at least partially filled with the conductive material. As an alternative to etching, masks may be used during one or more stages of deposition or growth of the first non-conductive redistribution material 28 to leave openings that may be filled with conductive material. As yet another alternative, the first redistribution conductors 30, 32 may be formed first, with masking or etching being utilized to expose the first redistribution conductors 30, 32 through the first non-conductive redistribution material 28.

In the configuration shown in FIG. 4, a first set of the first redistribution conductors 30 are electrically connected to the first conductive vias 22 in the first conductive frame members 18. The other set of first redistribution conductors 32 are electrically connected to the contacts 14 on the second face 12b of the first semiconductor die 12. The pitch of the portions of the first redistribution conductors 30, 32 exposed through the first non-conductive redistribution material 28 may be varied according to need. For example, the pitch of the first redistribution conductors 30 connected to the first conductive vias 22 need not be laterally offset from the first conductive vias 22, which is the configuration shown in FIG. 4.

Figure 5:
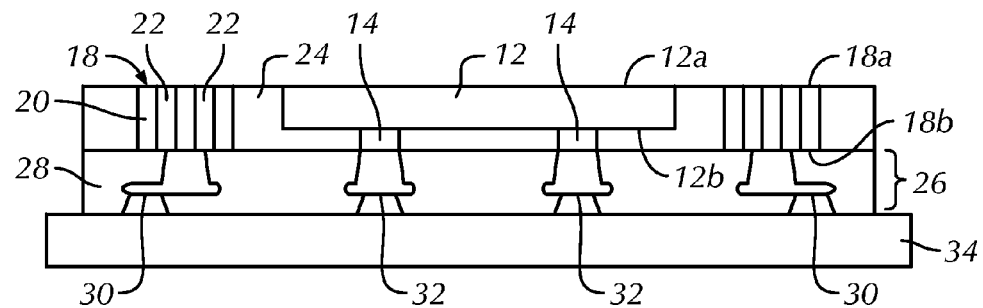
FIG. 5 is an inverted cross-sectional side elevational view of the structure of FIG. 4 following thinning and the addition of a second carrier.

Referring to FIG. 5, the first redistribution layer 26 is mounted to a second carrier 34 with tape (not shown). The first conductive frame members 18 are then thinned at the first faces 18a thereof to expose the first conductive vias 22 at a side opposite to the first redistribution layer 26. The first encapsulation layer 24 and the first semiconductor die 12 are also optionally thinned such that the first faces 12a, 18a of the first semiconductor die 12 and the first conductive frame members 18, as well as the first encapsulation layer 24 remain level opposite to the first redistribution layer 26. The thinning process is preferably carried out by grinding. Other processes, such as laser ablation, polishing, or the like may be used as well to remove the necessary material.

Figure 6:
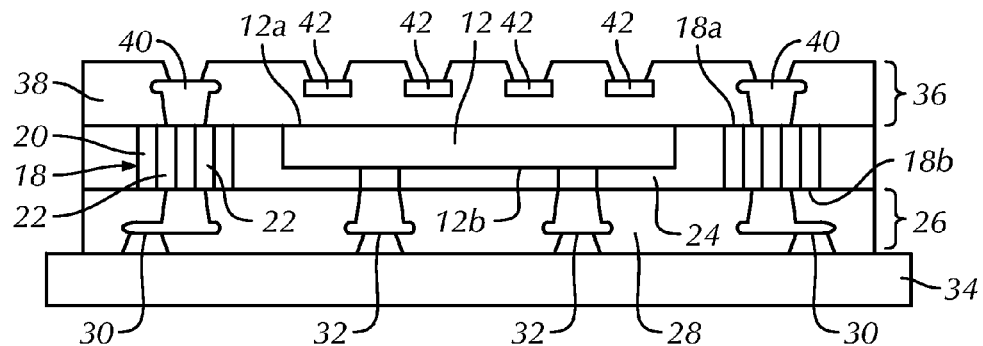
FIG. 6 is a cross-sectional side elevational view of the structure of FIG. 5 following formation of a second redistribution layer in accordance with a first preferred embodiment of the present invention.

Referring to FIG. 6, a second redistribution layer 36 is formed on the thinned first faces 12a, 18a of the first semiconductor die 12 and the first conductive frame members 18. The second redistribution layer 36 includes a second non-conductive redistribution material 38 that surrounds second redistribution conductors 40, which are electrically connected to the first conductive vias 22, and an array of grid array receptor pads 42. The second non-conductive redistribution material 38 is preferably a dielectric or polymer material, such as oxide, nitride, or the like. The second redistribution conductors 40 and grid array receptor pads 42 are conversely made from a conductive material, such as copper, aluminum, gold, or the like. It is preferred that at least the grid array receptor pads 42 are gold-plated.

The second redistribution layer 36 may be formed using the same or similar techniques as the first redistribution layer 26. One notable exception is that the grid array receptor pads 42 preferably do not extend all of the way through the second redistribution layer 36 to the first semiconductor die 12. Rather, it is preferred that the grid array receptor pads 42 are electrically connected to electrical traces (not shown) that traverse the second redistribution layer 36. However, the invention is not limited to this configuration, and the grid array receptor pads 42 may extend to and directly electrically connect with the first face 12a of the first semiconductor die 12 if desired.

Figure 7:
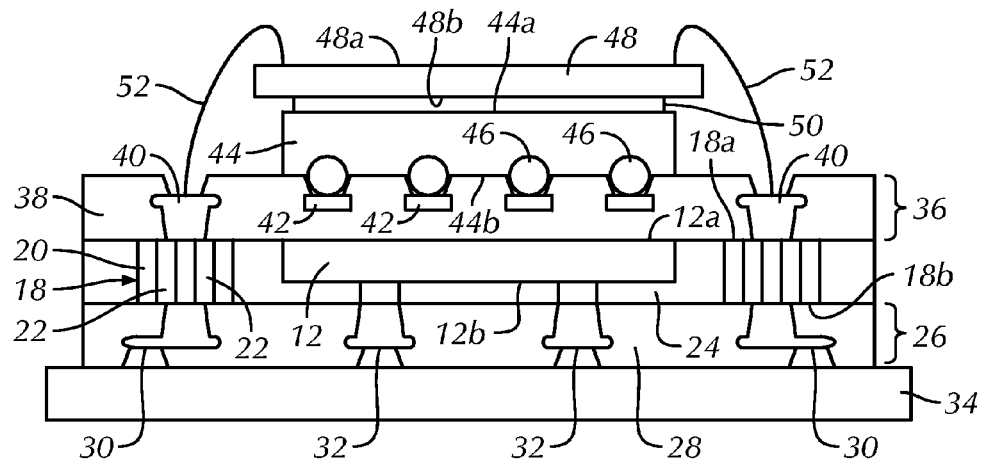
FIG. 7 is a cross-sectional side elevational view of the structure of FIG. 6 following the addition of second and third semiconductor dies and wire bonding.

Referring to FIG. 7, a second semiconductor die 44 having a first face 44a and an opposing second face 44b is mounted to the second redistribution layer 36. The second semiconductor die 44 may be made from any semiconductor material or combinations of materials, such as gallium arsenide, silicon germanium, silicon-on-insulator (SOI), silicon, monocrystalline silicon, the like, and combinations of the above. Preferably, the second semiconductor die 44 is a "flip-chip" with a ball grid array (BGA), formed of a plurality of spaced apart solder balls 46, or like configuration arranged on the second face 44b thereof. The second semiconductor die 44 is attached to the second redistribution layer 36 such that each of the solder balls 46 of the ball grid array are electrically connected to corresponding ones of the grid array receptor pads 42.

Still further, a third or top semiconductor die 48 having a first face 48a and an opposing second face 48b may be mounted to the first face 44a of the second semiconductor die 44 to form a die stack. The third semiconductor die 48 may be made from any semiconductor material or combinations of materials, such as gallium arsenide, silicon germanium, silicon-on-insulator (SOI), silicon, monocrystalline silicon, the like, and combinations of the above. The second face 48b of the third semiconductor die 48 is preferably bonded to the first face 44a of the second semiconductor die 44 using an adhesive 50, although other methods of attachment, such as tape, welding, mechanical fasteners, or the like, may be used as well.

The third semiconductor die 48 may be mounted to the second semiconductor die 44 either simultaneously with, before, or after the second semiconductor die 44 is mounted to the second redistribution layer 36. It is preferable that the third semiconductor die 48 be bonded to the second semiconductor die 44 beforehand so that the second and third semiconductor dies 44, 48 are mounted to the second redistribution layer 36 as a single unit.

The third semiconductor die 48 is preferably wire bonded to the second redistribution conductors 40 to create an electrical connection thereto. Wires 52 coupled between the first face 48a of the third semiconductor die 48 and the second redistribution conductors 40 are preferably in the form of gold wires, although other conductive materials may be used. In addition, the point of attachment for the wires 52 may be in locations on the third semiconductor die 48 other than the first face 48a. In this configuration, the second and third semiconductor dies 44, 48 can electrically communicate with one another via the second redistribution layer 36, and electrical communication with either of the second and third semiconductor dies 44, 48 with the first semiconductor die 12 is facilitated by the first conductive vias 22. However, other methods of interconnecting the three semiconductor dies 12, 44, 48 may be used as well. Additional semiconductor dies (not shown) may also be attached as part of the device 10.

Figure 8:
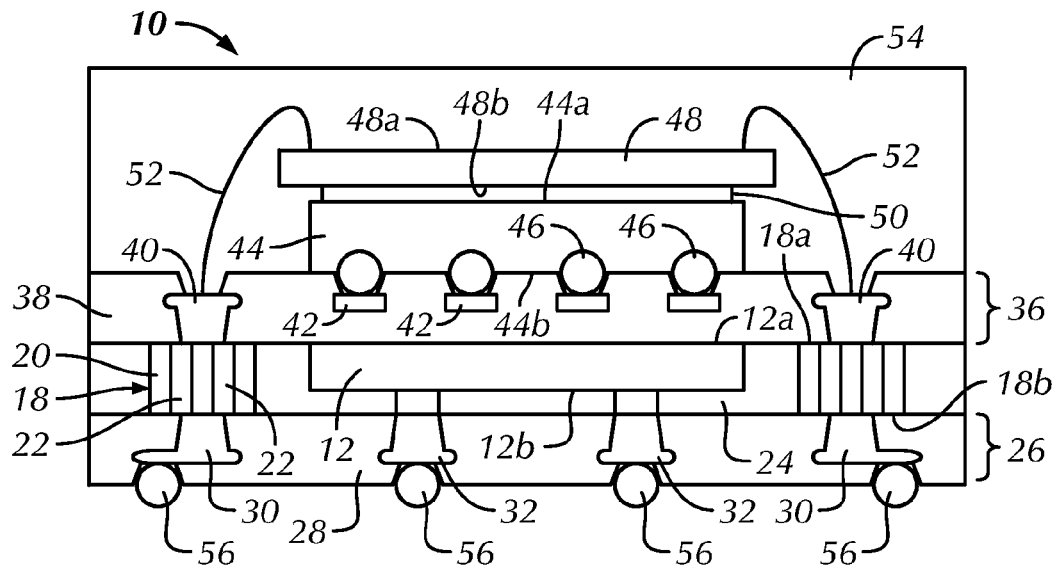
FIG. 8 is a cross-sectional side elevational view of the structure of FIG. 7 following formation of a second encapsulation layer, second carrier removal, and solder ball attachment.

Referring to FIG. 8, a second encapsulation layer 54 is formed on the second redistribution layer 36 to embed the second and third semiconductor dies 44, 48, the wires 52, and the second redistribution conductors 40. The second encapsulation layer 54 is preferably formed from a mold compound, such as a ceramic material, a polymeric material, or the like. The second encapsulation layer 54 may be formed by liquid encapsulation, compression molding, or the like, followed by curing.

Preferably after the second encapsulation layer 54 is formed, the second carrier 34 is removed from the first redistribution layer 26. A conventional attachment process may be performed to attach solder balls 56 to the first redistribution conductors 30, 32 to allow an electrical connection to additional or external devices (not shown). Multiple devices 10 can be formed on a single carrier 16, 34, and singulation preferably takes place after the solder balls 56 are formed at the first redistribution layer 26.

A second preferred embodiment of a method of making a semiconductor device 100 (FIG. 12) in accordance with the invention will now be described. The process for forming the semiconductor device 100 shown in FIG. 12 preferably begins with the steps shown in FIGS. 1-5, although variations are possible in keeping with the invention.

Figure 9:
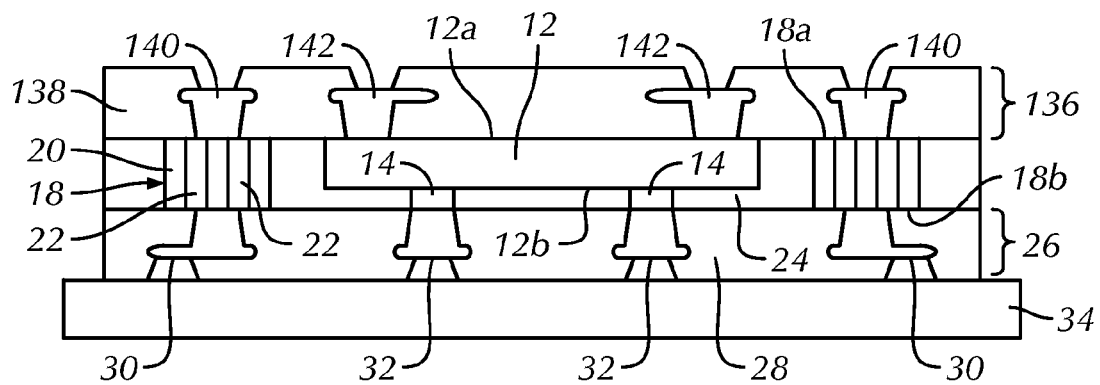
FIG. 9 is a cross-sectional side elevational view of the structure of FIG. 5 following formation of a second redistribution layer in accordance with a second preferred embodiment of the present invention.

Referring to FIG. 9, a second redistribution layer 136 is formed on the thinned first faces 12a, 18a of the first semiconductor die 12 and the first conductive frame members 18. The second redistribution layer 136 includes a second non-conductive redistribution material 138 that surrounds an array of second redistribution conductors 140, 142. The second redistribution layer 136 is preferably formed according to the techniques and materials generally described above.

A first set of the second redistribution conductors 140 are electrically connected to the first conductive vias 22 in the first conductive frame members 18. The other set of second redistribution conductors 142 are preferably electrically connected to contacts or pads (not shown) on the first face 12a of the first semiconductor die 12.

Figure 10:
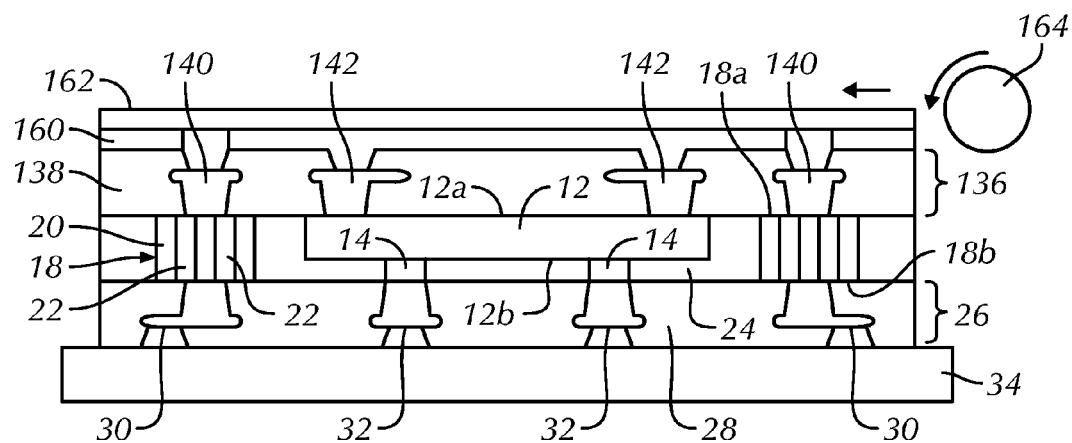
FIG. 10 is a cross-sectional side elevational view of the structure of FIG. 9 during a screen print process.

Referring to FIG. 10, the openings in the second redistribution layer 136 exposing the first set of second redistribution conductors 140 in communication with the conductive vias 22 are preferably screen printed with a solder paste 162 in preparation for subsequent steps. For example, a screen printing stencil 160 may be provided that covers the second redistribution layer 136 except for the openings leading to the first set of second redistribution conductors 140 in communication with the conductive vias 22. The solder paste 162 is laid over the stencil 160 and pressed into the indicated openings by a press roller 164.

Figure 11:
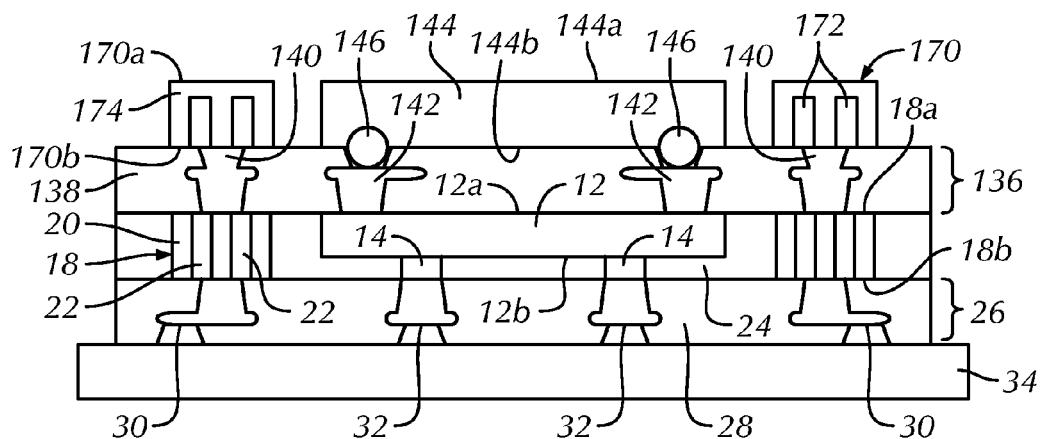
FIG. 11 is a cross-sectional side elevational view of the structure of FIG. 10 following placement of a second semiconductor die and second conductive frame members.

Referring to FIG. 11, a second semiconductor die 144 having a first face 144a and an opposing second face 144b is mounted to the second redistribution layer 136. The second semiconductor die 144 may be made from any semiconductor material or combinations of materials, such as gallium arsenide, silicon germanium, silicon-on-insulator (SOI), silicon, monocrystalline silicon, the like, and combinations of the above. Preferably, the second semiconductor die 144 is a "flip-chip" with a plurality of solder balls 146 arranged on the second face 144b thereof. The second semiconductor die 144 is attached to the second redistribution layer 136 such that each of the solder balls 146 are electrically connected to corresponding ones of the other set of second redistribution conductors 142. Thus, the second semiconductor die 144 is directly electrically connected to the first semiconductor die 12 via a portion of the other set of second redistribution conductors 142 that are electrically connected to the first semiconductor die 12.

In addition, one or more second conductive frame members 170 are also mounted to the second redistribution layer 136. Each second conductive frame member 170 includes a via insulating material 174, such as a dielectric or polymer material, such as oxide, nitride, or the like, and has a first face 170a and an opposing second face 170b.

The via insulating material 174 surrounds and embeds one, and preferably more, second conductive vias 172. The second conductive vias 172 are preferably made from a conductive material such as copper or aluminum. The second conductive vias 172 are preferably exposed at the second face 170b of the conductive frame member 170, i.e., directly facing the second redistribution layer 136, and more specifically, one of the second redistribution conductors 140 of the first set is in contact with the first conductive vias 22 in a first conductive frame member 18. The second conductive vias 172 extend into the via insulating material 174 toward the first face 170a of the second conductive frame member 170. Although the ends of the second conductive vias 172 opposite the second face 170b of the second conductive frame member 170 are shown as being buried in the via insulating material 174, the ends may alternatively be pre-exposed at the first face 170a of the conductive frame member 170. Formation of the second conductive frame members 170 is preferably the same or similar to that of the first conductive frame members 18 described above. According to this configuration, the second conductive vias 172 are in electrical connection with the first conductive vias 22 through the second redistribution layer 136.

Figure 12:
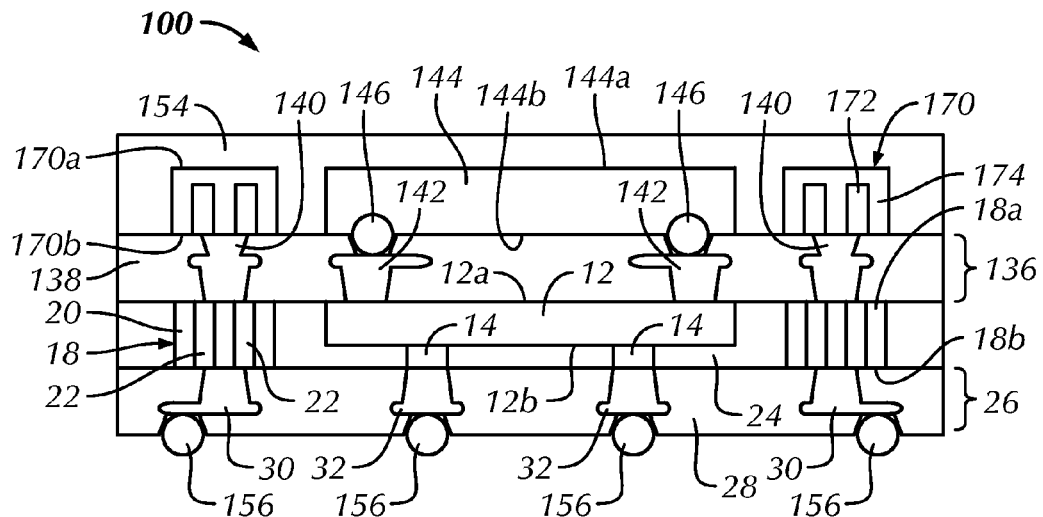
FIG. 12 is a cross-sectional side elevational view of the structure of FIG. 11 following formation of a second encapsulation layer, second carrier removal, and solder ball attachment.

Referring to FIG. 12, a second encapsulation layer 154 is formed on the second redistribution layer 136 to embed the second semiconductor die 144 and the second conductive frame members 170. The second encapsulation layer 154 is preferably formed from a mold compound, such as a ceramic material, a polymeric material, or the like. The second encapsulation layer 154 may be formed by liquid encapsulation, compression molding, or the like, followed by curing.

Preferably after the second encapsulation layer 154 is formed, the second carrier 34 is removed from the first redistribution layer 26. A conventional attachment process may be performed to attach solder balls 156 to the first redistribution conductors 30, 32 to allow an electrical connection to additional or external devices (not shown). Multiple devices 100 can be formed on a single carrier 16, 34, and singulation preferably takes place after the solder balls 156 are formed at the first redistribution layer 26.

Figure 13:
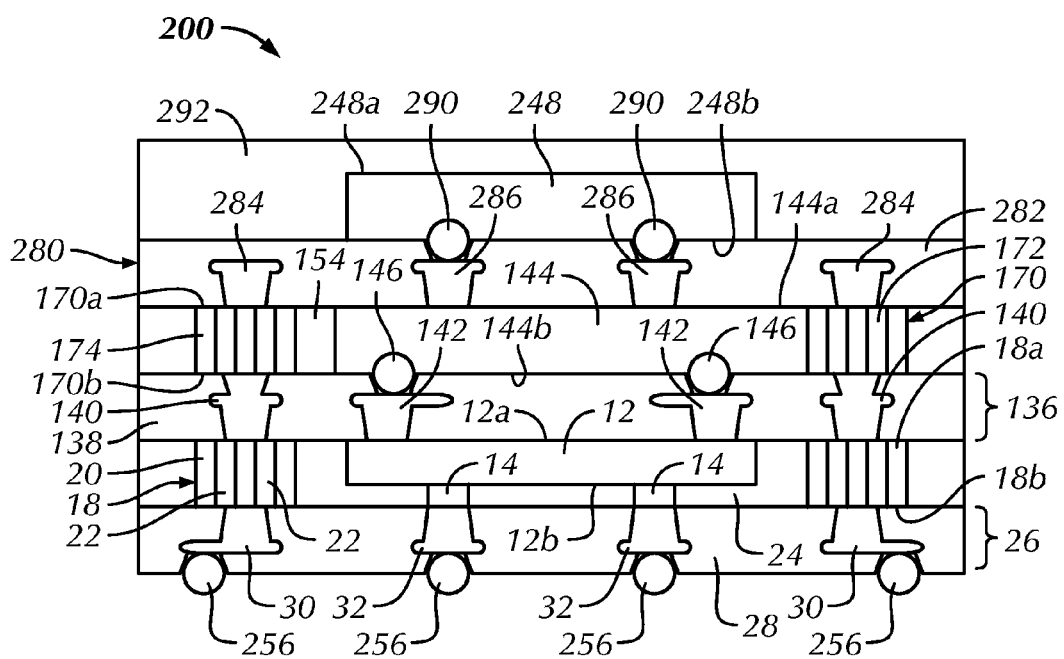
FIG. 13 is a cross-sectional side elevational view of the structure of FIG. 12 modified to include a third semiconductor die, third redistribution layer, and third encapsulation layer in accordance with a third preferred embodiment of the present invention.

Rather than finalizing the semiconductor device 100 in FIG. 12 following formation of the second encapsulation layer 154, additional process steps may be performed to create a semiconductor device 200 like that shown in FIG. 13.

For example, a portion of the second encapsulation layer 154 is preferably removed, by grinding or the like, to expose the first faces 144a, 170a of the second semiconductor die 144 and the second conductive frame members 170. If necessary, the second conductive frame members 170 (and preferably also the second semiconductor die 144) are thinned at the first faces 170a thereof to expose the second conductive vias 172 at a side opposite to the second redistribution layer 136. The thinning is preferably performed by a grinding process, although other processes such as laser ablation, polishing, or the like may be used as well to remove the necessary material.

A third redistribution layer 280 may be formed on the exposed first faces 144a, 170a of the second semiconductor die 144 and the second conductive frame members 170 in a manner similar to that of the first and second redistribution layers 26, 136. Specifically, the third redistribution layer 280 includes a third non-conductive redistribution material 282 that surrounds an array of third redistribution conductors 284, 286. The third redistribution layer 284 is preferably formed according to the techniques and materials generally described above.

A first set of the third redistribution conductors 284 are electrically connected to the second conductive vias 172 in the second conductive frame members 170. In addition, the first set of the third redistribution conductors are preferably buried in the third non-conductive redistribution material 282. The other set of third redistribution conductors 286 are preferably electrically connected to contacts or pads (not shown) on the first face 144a of the second semiconductor die 144, and are exposed through the third redistribution layer 280.

A third semiconductor die 248 having a first face 248a and an opposing second face 248b is mounted to the third redistribution layer 280. The third semiconductor die 248 may be made from any semiconductor material or combinations of materials, such as gallium arsenide, silicon germanium, silicon-on-insulator (SOI), silicon, monocrystalline silicon, the like, and combinations of the above. Preferably, the third semiconductor die 248 is a "flip-chip" with a plurality of solder balls 290 arranged on the second face 248b thereof. The third semiconductor die 248 is attached to the third redistribution layer 280 such that each of the solder balls 290 are electrically connected to corresponding ones of the other set of third redistribution conductors 286 in communication with the second semiconductor die 144.

A third encapsulation layer 292 is formed on the third redistribution layer 280 to embed the third semiconductor die 248. The third encapsulation layer 292 is preferably formed from a mold compound, such as a ceramic material, a polymeric material, or the like. The third encapsulation layer 292 may be formed by liquid encapsulation, compression molding, or the like, followed by curing.

Preferably after the third encapsulation layer 292 is formed, the second carrier 34 is removed from the first redistribution layer 26. A conventional attachment process may be performed to attach solder balls 256 to the first redistribution conductors 30, 32 to allow an electrical connection to additional or external devices (not shown). Multiple devices 200 can be formed on a single carrier 16, 34, and singulation preferably takes place after the solder balls 256 are formed at the first redistribution layer 26.

Embodiments of the present invention offer lower cost and reliable three-dimensional packaging by taking advantage of the process flow of RCP techniques and using pre-filled vias to establish inter-die connections.

In the foregoing specification, the invention has been described with reference to specific examples of embodiments of the invention. It will, however, be evident that various modifications and changes may be made therein without departing from the broader spirit and scope of the invention as set forth in the appended claims.

Those skilled in the art will recognize that boundaries between the above-described operations are merely illustrative. The multiple operations may be combined into a single operation, a single operation may be distributed in additional operations and operations may be executed at least partially overlapping in time. Further, alternative embodiments may include multiple instances of a particular operation, and the order of operations may be altered in various other embodiments.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

In the claims, the word 'comprising' or 'having' does not exclude the presence of other elements or steps then those listed in a claim. Further, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. A method of making a semiconductor device, the method comprising:
    providing a first semiconductor die having opposing first and second faces and at least one conductive frame member proximate the first semiconductor die comprising a via insulating material and opposing first and second faces, the first semiconductor die having at least one contact at the second face thereof, the at least one conductive frame member having at least one conductive via exposed at the second face thereof and extending into the via insulating material toward the first face thereof;
    forming a first encapsulation layer to embed the first faces of the first semiconductor die and the at least one conductive frame member;
    forming a first redistribution layer on the second faces of the first semiconductor die and the at least one conductive frame member, the first redistribution layer including a first non-conductive redistribution material surrounding an array of first redistribution conductors respectively electrically connected to the at least one conductive via and the at least one contact;
thinning the at least one conductive frame member at the first face thereof to expose the at least one conductive via at a side opposite to the first redistribution layer;
forming a second redistribution layer on the first faces of the at least one conductive frame member and the first semiconductor die, the second redistribution layer including a second non-conductive redistribution material surrounding at least one second redistribution conductor, electrically connected to the at least one conductive via, and a plurality of grid array receptor pads;
mounting a second semiconductor die having opposing first and second faces to the second redistribution layer such that a ball grid array (BGA) on the second face of the second semiconductor die is electrically connected to the plurality of grid array receptor pads in the second redistribution layer;
mounting a third semiconductor die having first and second faces to the first face of the second semiconductor die;
wire bonding the third semiconductor die to the at least one second redistribution conductor; and
forming a second encapsulation layer on the second redistribution layer to embed the second semiconductor die, the third semiconductor die, the wires, and the at least one second redistribution conductor.

2. The method of claim 1, wherein the second faces of the first semiconductor die and the at least one conductive frame member are mounted to a carrier prior to formation of the first encapsulation layer.

3. The method of claim 2, further comprising removing the carrier prior to the formation of the first redistribution layer.

4. The method of claim 1, further comprising mounting the first redistribution layer to a carrier.

5. The method of claim 4, further comprising removing the carrier from the first distribution layer following the formation of the second encapsulation layer.

6. The method of claim 1, wherein the step of thinning the first face of the at least one conductive frame member includes grinding the first face of the at least one conductive frame member.

7. The method of claim 6, further comprising grinding the first encapsulation layer and the first face of the first semiconductor die.

8. The method of claim 1, further comprising attaching solder balls to the first redistribution conductors after the step of forming the second encapsulation layer.

9. A method of making a semiconductor device, the method comprising:
providing a first semiconductor die having opposing first and second faces and at least one first conductive frame member proximate the first semiconductor die comprising a first via insulating material, the first semiconductor die having at least one contact at the second face thereof, the at least one conductive frame member having at least one first conductive via exposed at the second face thereof and extending into the first via insulating material toward the first face thereof;
forming a first encapsulation layer to embed the first faces of the first semiconductor die and the at least one first conductive frame member;
forming a first redistribution layer on the second faces of the first semiconductor die and the at least one first conductive frame member, the first redistribution layer including a first non-conductive redistribution material surrounding an array of first redistribution conductors respectively electrically connected to the at least one conductive via and the at least one contact;
thinning the at least one first conductive frame at the first face thereof to expose the at least one first conductive via at a side opposite to the first redistribution layer;
forming a second redistribution layer on the first faces of the at least one first conductive frame member and the first semiconductor die, the second redistribution layer including a second non-conductive redistribution material surrounding an array of second redistribution conductors respectively electrically connected to the at least one first conductive via and to the first semiconductor die;
mounting a second semiconductor die having first and second faces to the second redistribution layer such that electrical connection is made between solder balls disposed on the second face of the second semiconductor layer and the second redistribution conductors that are electrically connected to the first semiconductor die;
mounting at least one second conductive frame member on the second redistribution layer, the at least one second conductive frame member having first and second faces, a second via insulating material, and at least one second conductive via exposed at the second face thereof and extending into the second via insulating material toward the first face thereof, the at least one second conductive via being placed in electrical connection with the second redistribution conductor electrically connected to the at least one first conductive via;
forming a second encapsulation layer on the second redistribution layer to embed the second semiconductor die and the at least one second conductive frame member.

10. The method of claim 9, further comprising removing a portion of the second encapsulation layer to expose the first faces of the second semiconductor die and the at least one second conductive frame member.

11. The method of claim 10, further comprising thinning the at least one second conductive frame member at the first face thereof to expose the at least one second conductive via at a side opposite to the second redistribution layer.

12. The method of claim 11, further comprising forming a third redistribution layer on the first faces of the at least one second conductive frame member and the second semiconductor die, the third redistribution layer including a third non-conductive redistribution material surrounding an array of third redistribution conductors respectively electrically connected to the at least one second conductive via and to the second semiconductor die.

13. The method of claim 12, further comprising mounting a third semiconductor die having first and second faces to the third redistribution layer such that electrical connection is made between solder balls disposed on the second face of the third semiconductor layer and the third redistribution conductors that are electrically connected to the second semiconductor die.

14. The method of claim 13, further comprising forming a third encapsulation layer on the third redistribution layer to embed the third semiconductor die.

15. The method of claim 14, further comprising forming solder balls connected to the first redistribution conductors after the formation of the third encapsulation layer.

16. The method of claim 9, further comprising mounting the first redistribution layer to a carrier.

17. The method of claim 16, further comprising removing the carrier following formation of the second encapsulation layer.

18. The method of claim 9, wherein the second faces of the semiconductor die and the at least one first conductive frame member are mounted on a carrier prior to the formation of the first encapsulation layer, the method further comprising removing the carrier prior to the formation of the first redistribution layer.

19. The method of claim 9, further comprising screen printing with solder paste openings in the second redistribution layer corresponding to the second redistribution conductors connected to the at least one first conductive via.

20. The method of claim 9, further comprising forming solder balls connected to the first redistribution conductors after the step of forming the second encapsulation layer.

\* \* \* \* \*